US012565112B2

(12) United States Patent
Garcia-Ferre et al.

(10) Patent No.: US 12,565,112 B2
(45) Date of Patent: Mar. 3, 2026

(54) ELECTRIC VEHICLE CHARGING CONNECTOR WITH EXTERNAL PASSIVE COOLING

(71) Applicant: ABB SCHWEIZ AG, Baden (CH)

(72) Inventors: Francisco Garcia-Ferre, Baden (CH); Jaroslav Hemrle, Baden-Dattwil (CH); Elise Fahy, Schlieren (CH); Pedram Kheiri, Hausen (CH); Ali Ugur, The Hague (NL); Wojciech Wysocki, Cracow (PL)

(73) Assignee: ABB E-Mobility B.V., Delft (NL)

( * ) Notice: Subject to any disclaimer, the term of this patent is extended or adjusted under 35 U.S.C. 154(b) by 1014 days.

(21) Appl. No.: 17/531,414

(22) Filed: Nov. 19, 2021

(65) Prior Publication Data

US 2022/0153153 A1     May 19, 2022

(30) Foreign Application Priority Data

Nov. 19, 2020    (EP) .................................... 20208725

(51) Int. Cl.
*H02J 7/14*          (2006.01)
*B60L 53/16*         (2019.01)
          (Continued)

(52) U.S. Cl.
CPC ............. *B60L 53/302* (2019.02); *B60L 53/16* (2019.02); *B60L 53/18* (2019.02); *H05K 7/20336* (2013.01)

(58) Field of Classification Search
CPC ......... B60L 53/302; B60L 53/16; B60L 53/18
          (Continued)

(56) References Cited

U.S. PATENT DOCUMENTS 9,493,083 B1 *  11/2016  Sumner .............. H01R 13/6272
2014/0284043 A1 *  9/2014  Arai ....................... H01L 23/467
                                                        165/96
(Continued)

FOREIGN PATENT DOCUMENTS

CN          106410493 A      2/2017
CN          106659069 A      5/2017
          (Continued)

OTHER PUBLICATIONS

Extended European Search Report, issued by the European Patent Office, regarding corresponding patent application Serial No. EP20208725.0; dated Jul. 9, 2021; 10 pages.

*Primary Examiner* — Alexis B Pacheco
(74) *Attorney, Agent, or Firm* — McCarter & English, LLP

(57) ABSTRACT

An electric vehicle charging connector (100) comprising an external enclosure (104), an inner enclosure, and a compartment (102) for power contacts. The external enclosure (104) encloses an inner enclosure (103), and is configured to receive and guide a cable (101) from a back end (111) of the electric vehicle charging connector (100) to the inner enclosure (103) at a front end (113) of the electric vehicle charging connector (100). The inner enclosure (103) comprises the compartment (102) and is configured to provide the cable (101) to the compartment (102). The electric vehicle charging connector (100) further comprises a heat pipe (106) comprising an evaporator (107), and a condenser (109). The evaporator (107) is attached to a heat source in the compartment (102) inside the inner enclosure (102), configured to conduct heat from the heat source via the external enclosure (104) to the environment, wherein at least a part of the heat pipe (106) is arranged outside the external enclosure (104).

20 Claims, 3 Drawing Sheets

(51) Int. Cl.
  *B60L 53/18* (2019.01)
  *B60L 53/302* (2019.01)
  *H02J 7/00* (2006.01)
  *H05K 7/20* (2006.01)

(58) Field of Classification Search
  USPC ......................................................... 320/109
  See application file for complete search history.

(56) References Cited

U.S. PATENT DOCUMENTS

| | | | | |
|---|---|---|---|---|
| 2014/0305153 A1* | 10/2014 | Arai | ...................... | H01L 23/473 |
| | | | | 62/190 |
| 2015/0013363 A1* | 1/2015 | Arai | ...................... | F25B 49/027 |
| | | | | 62/509 |
| 2017/0320397 A1* | 11/2017 | Zaki | ........................ | B60L 53/14 |
| 2019/0109409 A1* | 4/2019 | Fuehrer | ................ | H01R 13/533 |
| 2019/0267822 A1* | 8/2019 | Waffner | ................ | H02J 7/0042 |
| 2019/0322186 A1* | 10/2019 | Arai | ........................ | B60L 53/18 |
| 2019/0344674 A1* | 11/2019 | Arai | ........................ | B60L 53/16 |
| 2020/0039369 A1* | 2/2020 | Burgermeister | ........ | B60L 53/18 |
| 2020/0099157 A1* | 3/2020 | Arai | ........................ | B60L 53/16 |
| 2020/0136290 A1* | 4/2020 | Arai | ........................ | H01R 13/10 |
| 2020/0307400 A1* | 10/2020 | de Chazal | .............. | B60L 53/18 |
| 2020/0313328 A1* | 10/2020 | Mathews | ............... | H01R 13/35 |
| 2020/0376970 A1* | 12/2020 | Berggren | ............... | B60L 3/003 |
| 2021/0063097 A1* | 3/2021 | Hitchcock | .............. | B60L 53/16 |
| 2022/0118866 A1* | 4/2022 | Han | ...................... | B60L 53/302 |

FOREIGN PATENT DOCUMENTS

| | | |
|---|---|---|
| CN | 206211121 U | 5/2017 |
| CN | 107444174 A | 12/2017 |
| CN | 208134122 U | 11/2018 |
| CN | 208134123 | 11/2018 |
| CN | 208142403 U | 11/2018 |
| CN | 111572375 A | 8/2020 |
| DE | 102016211464 A1 | 12/2017 |
| WO | 2019192249 A1 | 10/2019 |

* cited by examiner

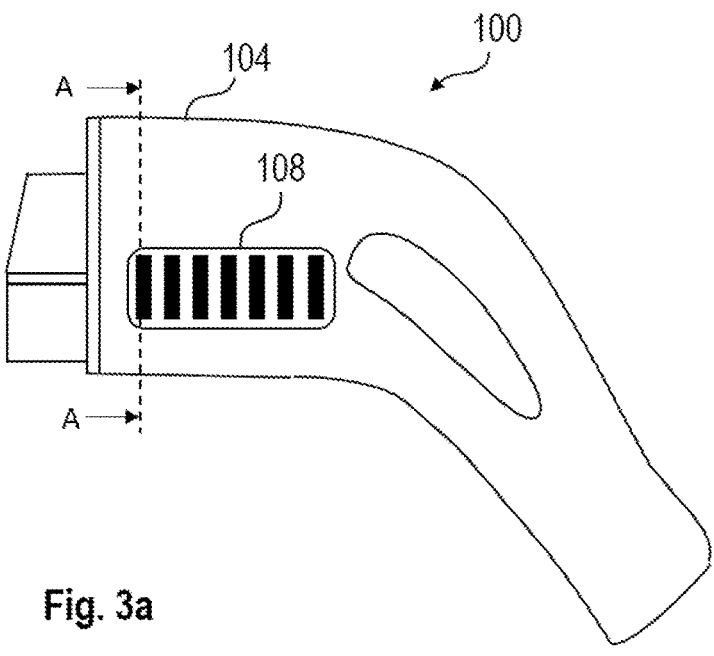
Fig. 3a
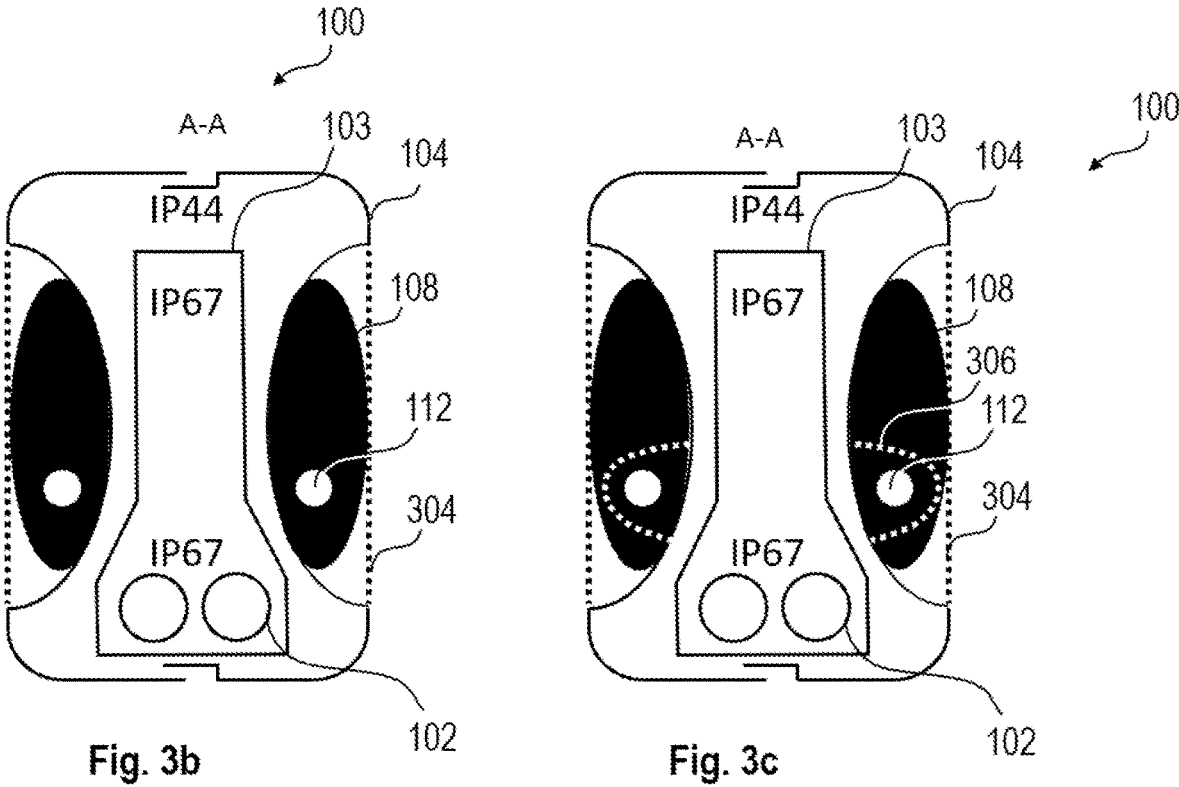
Fig. 3b                            Fig. 3c

ELECTRIC VEHICLE CHARGING CONNECTOR WITH EXTERNAL PASSIVE COOLING

CROSS-REFERENCE TO RELATED APPLICATIONS

This application claims the benefit of priority patent application European Serial No.: 20208725.0, filed on Nov. 19, 2020; which is herein incorporated by reference in its entirety.

FIELD OF THE INVENTION

The present invention relates to an electric vehicle charging connector, a charging station and a use of a heat pipe in the electric vehicle charging connector.

BACKGROUND

One limiting factor in charging cables for electric vehicles is the heat that is generated when high currents flow through the cable and the electrical connector from the charging station to the battery of a vehicle. The heat may be actively conducted away from the heat sources using liquids. In this way current rates over 500 A are achieved. For this kind of cooling arrangements are required that comprise and conduct the liquid from heat sinks to the heat sources and back. Additional devices such as pumps are necessary. Alternatively, passive cooling is possible. However, with existing designs only current ratings up to 200 A are achievable. Passive cooling needs a design as hollows in the enclosure or material of the enclosure for not insulating the heat in the enclosure. Such designs may not be effective or lead to a high weight of the charging cable.

SUMMARY

The objective of the invention is to provide an electric vehicle charging connector with improved IP rating while maintaining thermal performance.

The problem is solved by the subject-matter of the independent claims. Embodiments are provided by the dependent claims, the following description and the accompanying figures.

The described embodiments similarly pertain to the electric vehicle charging connector, the charging station, and the use of the heat pipe in an electric vehicle charging connector. Synergetic effects may arise from different combinations of the embodiments although they might not be described in detail.

Technical terms are used by their common sense. If a specific meaning is conveyed to certain terms, definitions of terms will be given in the following in the context of which the terms are used.

According to a first aspect, an electric vehicle charging connector comprising an external enclosure, an inner enclosure, and a compartment for power contacts is provided. The external enclosure encloses an inner enclosure, and is configured to receive and guide a cable from a back end of the electric vehicle charging connector to the inner enclosure at a front end of the electric vehicle charging connector. The inner enclosure comprises the compartment, and is configured to provide the cable to the compartment. The electric vehicle charging connector further comprises a heat pipe comprising an evaporator and a condenser. The evaporator is attached to a heat source in the compartment inside the inner enclosure, configured to conduct heat from the heat source via the external enclosure to the environment, wherein at least a part of the heat pipe is arranged outside the external enclosure.

The inner and the external enclosure protect the electric vehicle charging connector from the environment. However, heat is generated in the compartment when high current flows through the cable and the electrical power contacts in the compartment during the charging process when charging the battery of, for example, a vehicle. The heat has to be dissipated. This is achieved by using a heat pipe comprising an evaporator that receives the heat from the heat source in the compartment and conducts the heat through the inner and external enclosure to the environment. At least a part of the heat pipe is arranged outside the external enclosure, which is at least a part of the heat conducting part and/or heat dissipation part, i.e., the condenser. The condenser may comprise fins to enlarge its surface such that its thermal performance is enhanced. The thermal performance of the heat pipe and thus the electric vehicle charging connector is high if at least a part of the heat pipe is outside the external enclosure.

According to an embodiment, the electric vehicle charging connector may further comprise a structure arranged at the outside of the external enclosure such that it forms, together with the external enclosure, a protected space for the part of the heat pipe that is outside the external enclosure. The structure may be made of the same or similar material as the external enclosure or also a consist of another material. That is, the structure may be an integral part of the external enclosure, or it may be a separate part that may be mounted to the external enclosure. The structure may have a flat shape or an outwardly curved shape such that the arrangement is mechanical stability is improved.

According to an embodiment, the part of the heat pipe that is outside the external enclosure is the condenser. That is, the complete condenser is on the outside, wherein the thermal bridge between the condenser and the evaporator forms the interface between the inside and the outside with respect to the external enclosure.

According to an embodiment, the part of the heat pipe that is outside the external enclosure is a part of the condenser. That is, opposed to the previous embodiment, not the complete condenser is on the outside but only a portion. This embodiment is extremely advantageous, because in this case the portion between the evaporator and the condenser is shifted to the inside of the external enclosure. Since the thermal bridge element has a possibly significant higher temperature as the ambient temperature, a user is protected from this element. Further, a part of the heat is already dissipated inside the external enclosure such that the external condenser part is the part having a lower temperature than the other part.

According to an embodiment, the inner enclosure is sealed from the external enclosure providing a high IP class protection. The external enclosure provides a medium IP class protection. For example, the IP class of the inner enclosure is IP67, and the IP class of the external enclosure is IP44. IP44 might not be reached with same thermal performance if the external enclosure would have just openings.

According to an embodiment, the electric vehicle charging connector comprises more than one heat pipe. Therefore, there may be also more than one condensers. For example, there are two heat pipes and the condensers may be arranged on the left and right sides of the connector.

These and other features, aspects and advantages of the present invention will become better understood with reference to the accompanying figure and the following description. Identical or equivalent elements are in principle provided with the same reference signs.

SHORT DESCRIPTION OF THE FIGURES

FIG. 1 shows a diagram of the inside of an electric vehicle charging connector, on which embodiments may be based on.

FIG. 2 shows a diagram of the inside of the electric vehicle charging connector of FIG. 1 with additionally a heat pipe, on which embodiments may be based on.

FIG. 3a shows a diagram of the outside of an electric vehicle charging connector according to an embodiment.

FIG. 3b shows a diagram of a sectional view of the an electric vehicle charging connector according to an embodiment.

FIG. 3b shows diagram of a sectional view of the an electric vehicle charging connector according to a further embodiment.

DETAILED DESCRIPTION OF EMBODIMENTS

Figure 1:
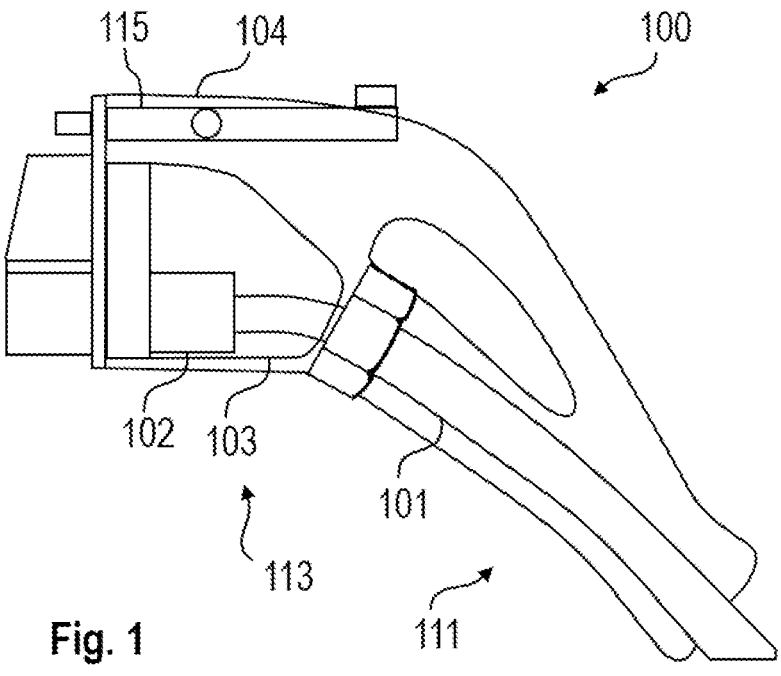

FIG. 1 shows a design of a charging connector are shown in FIG. 1 on which the inventive arrangement is based on. The electric vehicle charging connector 100 comprises an external enclosure 104, an inner enclosure, and a compartment 102 for power contacts. The external enclosure 104 encloses an inner enclosure 103, and is configured to receive and guide a cable 101 from a back end 111 of the electric vehicle charging connector 100 to the inner enclosure 103 at a front end 113 of the electric vehicle charging connector 100. The inner enclosure 103 comprises the compartment 102 and is configured to provide the cable 101 to the compartment 102. The function of the internal casing 103 is to ensure electrical insulation, mechanical strength, prevent water and dirt contamination. For this reason, casing 103 is massively sealed, and in some designs also nearly completely potted structure. Also the contact holder 102 can be treated in this way. The combination of components 102 and 103 is further enclosed in external casing 104. The connector may contain an additional "latch element" 115. This element is a lever used to lock the connector to the car, and facilitate the communication between car and charging post so that the charging session can begin.

The purpose of the overall design is to have a triple mechanical protection of the contacts, guaranteed by the contact holder 102, the internal casing 103 and the external casing 104, and a double IP protection, guaranteed by the contact holder 102 and the internal casing 103. Another reason for separating casing 103 and 104 is weight. The severe functional requirements on internal casing 103 lead to a fairly robust and heavy design, that is also potentially "sealed for life". On the other hand, the bulkier external casing 104 is built in a fairly light manner, with focus on weight reduction and comfort.

Figure 2:
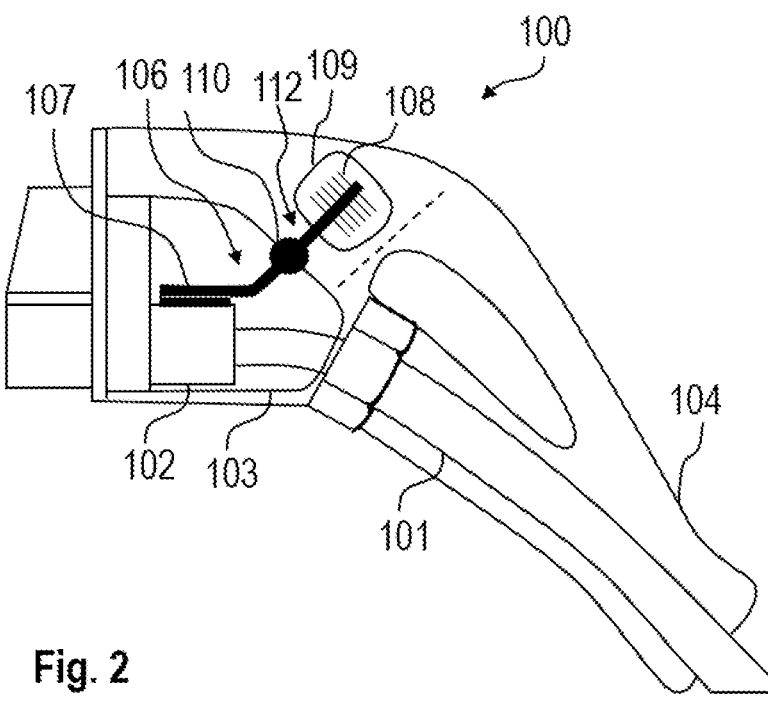

FIG. 2 shows a diagram of the electric vehicle charging connector of FIG. 1 with additionally a heat pipe 106, on which embodiments may be based on. The electric vehicle charging connector 100 in FIG. 2a has essentially the same design as the electric vehicle charging connector 100 of FIG. 1, however, shows a heat pipe 106 as heat conductor that is arranged inside the enclosures 103, 104. The heat receiving part, that is, the evaporator 107 of the heat pipe in FIG. 2a, is attached in a way to be in close thermal contact with the heat source, or hot spot, in particular close to the contacts of the connector. The heat pipe then extracts the heat from the internal enclosure 103, which can be highly sealed with respect to electric, water, dust and mechanical protection of the contact and related parts. The heat is then transported from the evaporator through the portion 112 and via seal 110 to the condenser 109 with condenser fins 108. The external enclosure 104 requires lower protection, and mainly functions as interface to the user. The heat pipe 106 ejects heat to the environment in the area 109 that comprises the condenser 109 of the heat pipe 106. There may be one heat pipe or several heat pipes per phase.

If the condenser or a part of the condenser would be exposed to air, for example inside the external enclosure 104, this would entail that water can penetrate the external casing or enclosure 104. This means that the IP class of such an arrangement is IPX0 (regardless of the dust ingress classification, indicated by the X, the water ingress classification will be 0), meaning that water enters the housing. This is highly undesired and may bring along issues in terms of (a) safety and (b) qualification of the connector by third parties according to existing standards (i.e. IEC 62196-3), which indicate a minimum IP class of IP44 for the casings in such kind of product. The presented arrangement solves this issue.

In FIG. 3a, the condenser 109 appears as element 108 at the outside of connector 100 on the external enclosure 104. The condenser is exposed to air. The following FIGS. 3b and 3c show a sectional view from the front side as indicated by the marking A-A.

FIG. 3b shows a cross sectional view of the connector 100 from the front side. The connector 100 comprises the external enclosure 104 that comprises the inner enclosure 103, which again comprises contact element compartments 102. The key element in the arrangement of the cooling system in this cross section is the condenser 109 that is exposed to fresh air outside of the external enclosure 104. The condenser 109 can be protected by an optional structure or net 304. The condenser 109 is in contact with the contact elements 102 as shown in the cross section of FIG. 2. by means of a thermal bridge 112, which could be a heat pipe element.

In FIG. 3c, a different embodiment is shown. Here, a part of the condenser 109 is positioned inside the external enclosure 104 but outside of the inner enclosure 103, such that only a part of the condenser 109 is exposed to fresh air. The circles 306 indicate that the portion 112 is inside the external enclosure 104. The benefit in this case is that the portion 112, which will be at a high temperature compared to the ambient temperature, may be less exposed to potential touch by end users, thereby increasing the safety. In this case, some of the fins 108 may be located inside the external enclosure 104.

Figure 4:
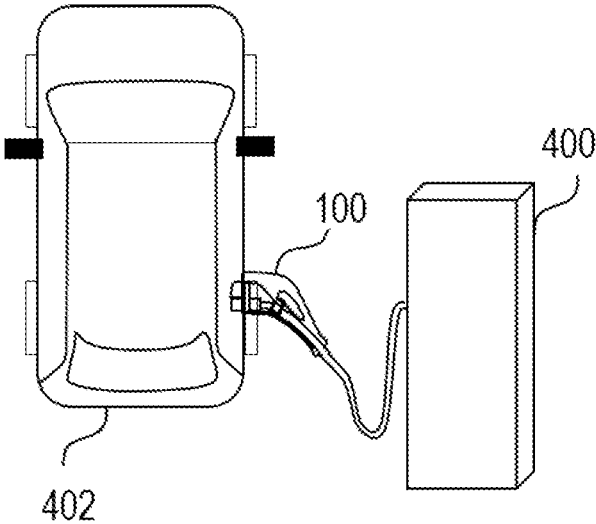
FIG. 4 shows schematic diagram of a charging station connected to a vehicle.

FIG. 4 shows as an example a schematic diagram of a charging station 400 connected to a vehicle 402 via an electric vehicle charging connector 100. The connection of the electric vehicle charging connector 100 to the charging station 400 is fixed, so that the electric vehicle charging connector 100 is part of the charging station 400.

Therefore, an adequate IP rating is achieved while guaranteeing thermal performance of the connector.

Other variations to the disclosed embodiments can be understood and effected by those skilled in the art in practicing the claimed invention, from the study of the drawings, the disclosure, and the appended claims. In the claims the word "comprising" does not exclude other elements or steps and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the claims.

The invention claimed is:

1. An electric vehicle charging connector comprising:
an external enclosure, an inner enclosure, and a compartment for power contacts;
    wherein the external enclosure encloses the inner enclosure, and is configured to receive and guide a cable from a back end of the electric vehicle charging connector to the inner enclosure at a front end of the electric vehicle charging connector;
    wherein the inner enclosure comprises the compartment and is configured to provide the cable to the compartment;
    wherein the inner enclosure is sealed from the external enclosure;
    wherein the inner enclosure provides a higher IP class protection than the external enclosure; and
a heat pipe comprising:
    an evaporator and a condenser,
        wherein the evaporator is attached to a heat source in the compartment inside the inner enclosure, configured to conduct heat from the heat source via the external enclosure to the environment,
        wherein at least a part of the heat pipe is arranged outside the external enclosure.

2. The electric vehicle charging connector according to claim 1, wherein the electric vehicle charging connector further comprises a structure arranged at the outside of the external enclosure such that it forms together with the external enclosure a protected space for the part of the heat pipe that is outside the external enclosure.

3. The electric vehicle charging connector according to claim 1, wherein the part of the heat pipe that is outside the external enclosure is the condenser.

4. The electric vehicle charging connector according to claim 1, wherein the part of the heat pipe that is outside the external enclosure is a part of the condenser.

5. The electric vehicle charging connector according to claim 1, wherein the inner enclosure provides a high IP class protection; and wherein the external enclosure provides a medium IP class protection.

6. The electric vehicle charging connector according to claim 1, wherein the electric vehicle charging connector comprises more than one heat pipe.

7. A charging station comprising an electric vehicle charging connector according to claim 1.

8. A method of using a heat pipe in an electric vehicle charging connector according to claim 1.

9. The electric vehicle charging connector according to claim 2, wherein the part of the heat pipe that is outside the external enclosure is the condenser.

10. The electric vehicle charging connector according to claim 2, wherein the part of the heat pipe that is outside the external enclosure is a part of the condenser.

11. The electric vehicle charging connector according to claim 2, wherein the inner enclosure provides a high IP class protection; and wherein the external enclosure provides a medium IP class protection.

12. The electric vehicle charging connector according to claim 3, wherein the inner enclosure provides a high IP class protection; and wherein the external enclosure provides a medium IP class protection.

13. The electric vehicle charging connector according to claim 4, wherein the inner enclosure provides a high IP class protection; and wherein the external enclosure provides a medium IP class protection.

14. The electric vehicle charging connector according to claim 2, wherein the electric vehicle charging connector comprises more than one heat pipe.

15. The electric vehicle charging connector according to claim 3, wherein the electric vehicle charging connector comprises more than one heat pipe.

16. The electric vehicle charging connector according to claim 4, wherein the electric vehicle charging connector comprises more than one heat pipe.

17. The electric vehicle charging connector according to claim 5, wherein the electric vehicle charging connector comprises more than one heat pipe.

18. A charging station comprising an electric vehicle charging connector according to claim 2.

19. A charging station comprising an electric vehicle charging connector according to claim 3.

20. A charging station comprising an electric vehicle charging connector according to claim 4.

* * * * *